United States Patent
Lai et al.

(10) Patent No.: US 12,130,310 B2
(45) Date of Patent: Oct. 29, 2024

(54) POWER MODULE DEVICE AND TEMPERATURE DETECTION METHOD THEREOF

(71) Applicant: DELTA ELECTRONICS, INC., Taoyuan (TW)

(72) Inventors: Wen-Shang Lai, Taoyuan (TW); Fu-Yuan Shih, Taoyuan (TW)

(73) Assignee: DELTA ELECTRONICS, INC., Taoyuan (TW)

( * ) Notice: Subject to any disclaimer, the term of this patent is extended or adjusted under 35 U.S.C. 154(b) by 243 days.

(21) Appl. No.: 17/806,498

(22) Filed: Jun. 12, 2022

(65) Prior Publication Data

US 2023/0194576 A1    Jun. 22, 2023

(30) Foreign Application Priority Data

Dec. 22, 2021   (CN) .......................... 202111584834.8

(51) Int. Cl.
*G01R 19/00* (2006.01)
*G01K 7/00* (2006.01)
*H03K 17/08* (2006.01)
*H03K 17/082* (2006.01)

(52) U.S. Cl.
CPC ..... *G01R 19/0084* (2013.01); *H03K 17/0822* (2013.01); *G01K 7/00* (2013.01); *H03K 17/08* (2013.01)

(58) Field of Classification Search
CPC ................ G01R 19/00; G01R 19/0084; G01R 19/0092; G01K 7/00; H03K 17/00; H03K 17/08; H03K 17/082; H03K 17/0822; H03K 2017/0806; H03K 2217/00; H03K 2217/0027
USPC .................................................. 324/200, 201
See application file for complete search history.

(56) References Cited

U.S. PATENT DOCUMENTS

2005/0224909 A1   10/2005  Yamaguchi et al.
2020/0366279 A1   11/2020  Ma et al.

FOREIGN PATENT DOCUMENTS

CN        105811765 A    7/2016
CN        105811765 B    8/2018

*Primary Examiner* — Hoai-An D. Nguyen
(74) *Attorney, Agent, or Firm* — CKC & Partners Co., LLC

(57) ABSTRACT

A power module device, comprising a main switch and a detection unit. The main switch is electrically connected between a first detection node and a second detection node. The first detection node and the second detection node are electrically connected between a plurality of power supply nodes, and are substantially two ends of the main switch. When the main switch is turned on, the main switch is configured to transmit a current flowing through the plurality of power supply nodes. The detection unit is electrically connected to the first detection node and the second detection node, and configured to detect a voltage across the two ends of the main switch to generate a detection voltage.

18 Claims, 7 Drawing Sheets

POWER MODULE DEVICE AND TEMPERATURE DETECTION METHOD THEREOF

CROSS-REFERENCE TO RELATED APPLICATION

This application claims priority to China Application Serial Number 202111584834.8, filed Dec. 22, 2021, which is herein incorporated by reference in its entirety.

BACKGROUND

Technical Field

The present disclosure relates to a power module device and a temperature detection method thereof, especially a technology for detecting a voltage across of the main switch to confirm its temperature.

Description of Related Art

Power module is a structure integrated with power semiconductor components, which is usually used as the core of power conversion and circuit control of electronic devices. The uses of power module include frequency conversion, rectification, voltage transformation, power amplification, power control, and can save energy loss. Therefore, the power module is widely used in various fields, such as mobile communications, consumer electronics, and energy devices.

SUMMARY

One aspect of the present disclosure is a power module device, comprising a main switch and a detection unit. The main switch is electrically connected between a first detection node and a second detection node. The first detection node and the second detection node are electrically connected between a plurality of power supply nodes, and are substantially two ends of the main switch. When the main switch is turned on, the main switch is configured to transmit a current flowing through the plurality of power supply nodes. The detection unit is electrically connected to the first detection node and the second detection node, and configured to detect a voltage across the two ends of the main switch to generate a detection voltage.

Another aspect of the present disclosure is a temperature detection method of a power module device, comprising: turning on a main switch to transmit a current flowing through a plurality of power supply nodes, wherein the main switch is electrically connected between a first detection node and a second detection node, the first detection node and the second detection node are electrically connected between the plurality of power supply nodes, and are substantially two ends of the main switch; detecting, by a detection unit, a voltage across the two ends of the main switch to generate a detection voltage, wherein the detection unit is electrically connected to the first detection node and the second detection node; and converting the detected voltage to a detected temperature value.

Another aspect of the present disclosure is a power module device, comprising a plurality of main switches and at least one detection unit. Each of the plurality of main switches is electrically connected between a plurality of detection nodes. The plurality of detection nodes are electrically connected between a plurality of power supply nodes, and are substantially two ends of the each of the plurality of main switches. When the each of the plurality of main switches is turned on, the each of the plurality of main switches is configured to transmit a current flowing through the plurality of power supply nodes. The at least one detection unit is electrically connected to the plurality of detection nodes, and is configured to detect a voltage across the two ends of the main switch to generate a detection voltage.

It is to be understood that both the foregoing general description and the following detailed description are by examples, and are intended to provide further explanation of the disclosure as claimed.

BRIEF DESCRIPTION OF THE DRAWINGS

The present disclosure can be more fully understood by reading the following detailed description of the embodiment, with reference made to the accompanying drawings as follows.

DETAILED DESCRIPTION

For the embodiment below is described in detail with the accompanying drawings, embodiments are not provided to limit the scope of the present disclosure. Moreover, the operation of the described structure is not for limiting the order of implementation. Any device with equivalent functions that is produced from a structure formed by a recombination of elements is all covered by the scope of the present disclosure. Drawings are for the purpose of illustration only, and not plotted in accordance with the original size.

It will be understood that when an element is referred to as being "connected to" or "coupled to", it can be directly connected or coupled to the other element or intervening elements may be present. In contrast, when an element to another element is referred to as being "directly connected" or "directly coupled," there are no intervening elements present. As used herein, the term "and/or" includes an associated listed items or any and all combinations of more.

Figure 1:
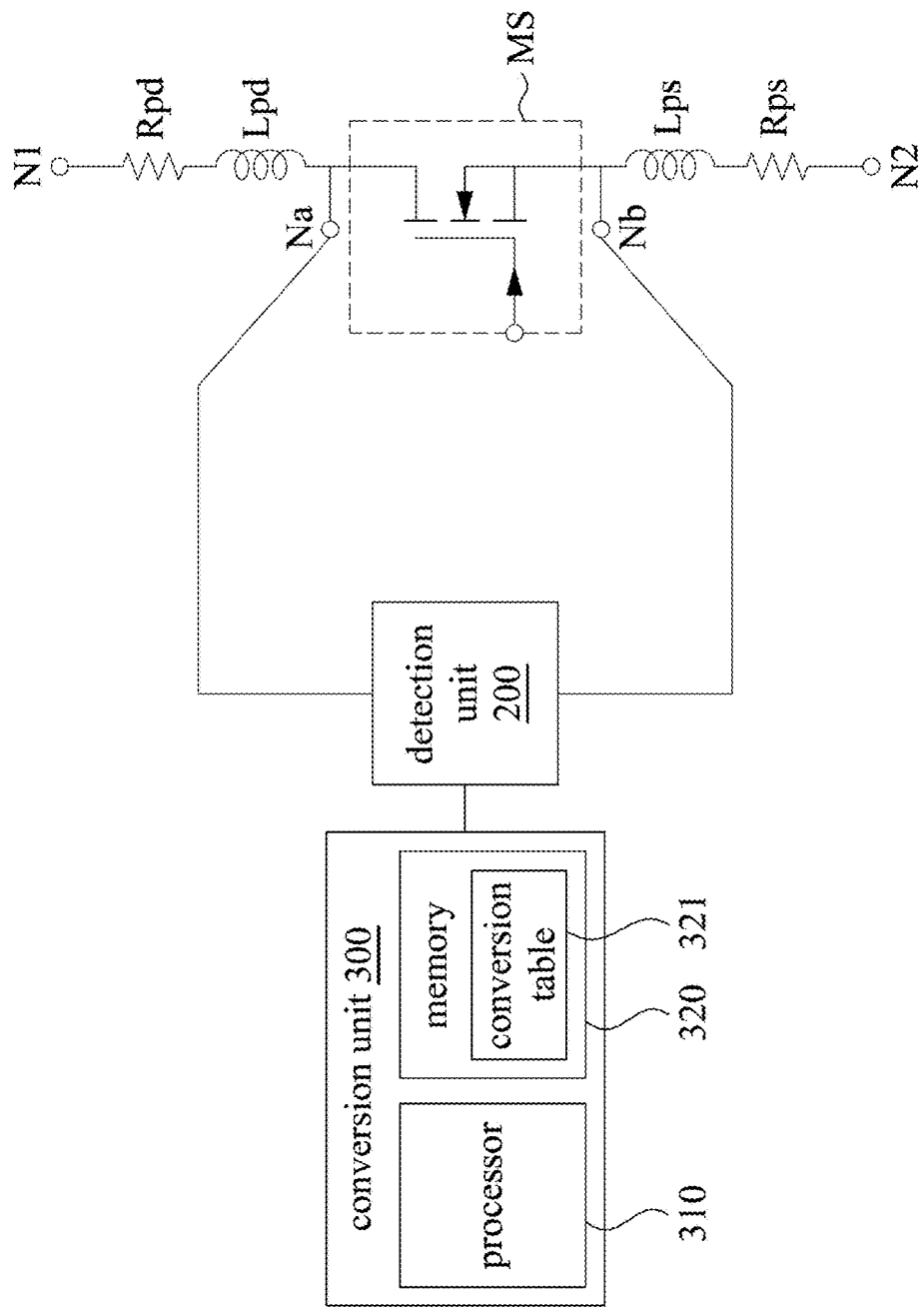
FIG. 1 is a schematic diagram of a power module device in some embodiments of the present disclosure.

FIG. 1 is a schematic diagram of a power module device 100 in some embodiments of the present disclosure. The power module device 100 at least includes a main switch MS. The main switch MS can be implemented by a power semiconductor device (or power electronic device), and is electrically connected to an external device, so as to provide functions such as frequency conversion, rectification, voltage transformation, power amplification or power control. In the circuit shown in FIG. 1, the main switch MS is a Metal-Oxide-Semiconductor Field-Effect Transistor (MOSFET), but the present disclosure is not limited to this. In some other embodiments, the main switch MS can also be implemented by an insulated gate bipolar transistor (IGBT).

In one embodiment, the main switch MS is electrically connected to a driver chip (die). In order to ensure that the main switch MS operates normally, the negative temperature coefficient thermistor (NTC) or a diode can be set in the power module device 100 to confirm the temperature of the main switch MS according to the voltage change. However, the methods of using NTC and diode to detect temperature are not ideal.

As shown in FIG. 1, the present disclosure directly detects a voltage across the two ends of the main switch MS by a detection unit 200, so as to calculate the current temperature of the main switch MS according to the relationship between the voltage and the temperature. In the embodiment, the main switch MS is electrically connected between a first detection node Na and a second detection node Nb. The first detection node Na and the second detection node Nb are electrically connected between the two power supply nodes N1, N2.

As shown in FIG. 1, there are at least one parasitic resistance (e.g., Rpd or Rps) and at least one parasitic inductance (e.g., Lpd or Lps) between the power supply nodes N1, N2 and the detection nodes Na, Nb. The parasitic resistance Rpd, Rps and the parasitic inductance Lpd, Lps are connected in series between the power supply nodes N1, N2 and the detection nodes Na, Nb, and are formed by conductors in the power module device 100. Alternatively stated, the detection node Na, Nb are substantially two ends of the main switch MS, and there is no redundant conductor impedance between the detection node Na, Nb and the main switch MS (or can be ignored because the impedance is too small). When the main switch MS is turned on, the main switch MS is configured to transmit current flowing through the power supply nodes N1, N2.

The detection unit 200 is directly connected to the first detection node Na and the second detection node Nb. The detection unit 200 is configured to detect the voltage across the two ends of the main switch MS, and generates a detection voltage according to the detection results. According to the relative relationship between the voltage and the temperature of the main switch MS, the current temperature of the main switch MS can be confirmed. In addition, since the detection unit 200 is directly connected to both ends of the main switch MS in parallel (i.e., the first detection node Na and the second detection node Nb), rather than being connected to the power supply nodes N1, N2, the detection voltage obtained by the detection unit 200 can directly reflect the voltage across of the main switch MS without errors due to the impedance or parasitic inductance of the conductors.

As shown in FIG. 1, in some embodiments, the power module device 100 further includes a conversion unit 300. The conversion unit 300 is electrically connected to the detection unit 200, and is configured to receive the detection voltage transmitted by the detection unit 200. The conversion unit 300 includes a processor 310 and a memory 320, and the memory 320 stores a conversion table 321. The conversion table 321 records temperature values of the main switch MS at various cross voltages. The processor 310 searches the conversion table 321 according to the detection voltage to find a detection temperature value corresponding to the detection voltage.

On the other hand, the main switch MS is in an turn-on or turn-off state with the operation of the external device (or the driver chip). The voltage across of the main switch MS varies significantly when the main switch MS is turned on or off. Specifically, the voltage across the two ends of the turned off main switch is much larger than the voltage across the two ends of the turned on main switch. If the detection unit 200 receives excessively high and low voltages during the detection process, when the conversion unit 300 calculates the detection temperature value, the excessively low voltage (i.e., the voltage across the two ends of the turned on main) will be ignored, or there will be errors in the calculation, resulting in inaccurate results. Therefore, in some embodiments, the detection unit 200 only receives the voltage across the two ends of the turned on main (cross voltage), and obtains the detection voltage value according to the cross voltage. Correspondingly, the detection temperature value obtained by the conversion unit 300 corresponds to the voltage across the two ends of the turned on main switch.

Figure 2:
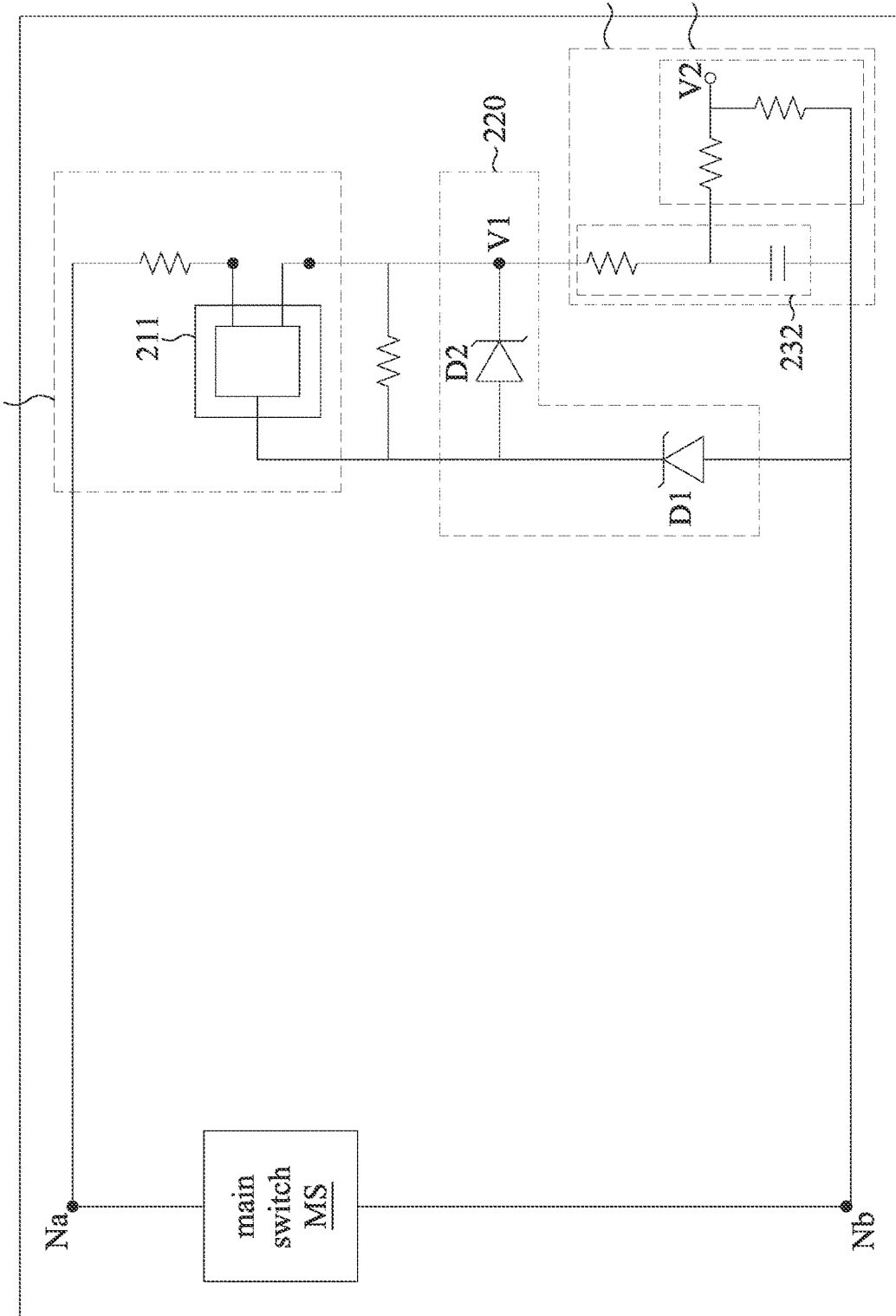
FIG. 2 is a schematic diagram of a detection unit in some embodiments of the present disclosure.

FIG. 2 is a schematic diagram of a detection unit 200 in some embodiments of the present disclosure. In some embodiments, the detection unit 200 includes a withstand voltage circuit 210, a clamp circuit 220 and a output circuit 230. The withstand voltage circuit 210 is electrically connected to the first detection node Na, and includes a withstand voltage switch 211. When the main switch MS is turned off, the voltage across the two ends of the main switch turns off the withstand voltage switch 211 (i.e., form an open circuit), but the voltage across the two ends of the main switch MS is less than a rated voltage of the withstand voltage switch 211 to ensure that the withstand voltage switch 211 is not damaged.

The clamp circuit 220 is electrically connected between the withstand voltage circuit 210 and the second detection node Nb. The withstand voltage switch 211 is electrically connected between the first detection node Na and the clamp circuit 220. Alternatively stated, a first terminal (drain) of the withstand voltage switch 211 connects to the first detection node Na, a second terminal (source) of the withstand voltage switch 211 connects to the clamp circuit 220. When the main switch MS is turned on, and the withstand voltage switch 211 is turned on accordingly, the clamp circuit 220 is configured to clamp an output of the withstand voltage circuit 210 (e.g., the source voltage of the withstand voltage switch 211) to form/output a clamping voltage V1.

in some embodiments, the clamp circuit 220 includes at least one zener diode D1, so that the clamping voltage V1 on one terminal of the clamp circuit 220, which is connects to the withstand voltage circuit 210, is less than the voltage across of the turned off main switch MS. Therefore, the clamp circuit 220 can further ensure that the clamping voltage V1 is kept within a certain voltage range to avoid damage to the detection unit 200. In some other embodiments, the clamp circuit 220 includes multiple zener diode D1 and D2. A node between the zener diode voltages D1, D2 is connected to the control terminal (gate) of the withstand voltage switch 211, and the zener diode D2 is connected to the second terminal (source) of the withstand voltage switch 211.

The output circuit 230 is electrically connected to the clamp circuit 220 and the second terminal of the withstand voltage switch 211, and is configured to receive the clamping voltage V1. The output circuit 230 generates a detection voltage V2 according to the clamping voltage V1. In some embodiments, the output circuit 230 further includes a voltage divider circuit 231. The voltage divider circuit 231 is configured to receive the clamping voltage V1, and divides the clamping voltage V1 through the multiple resistances with different impedances to convert the clamping voltage V1 into the detection voltage V2. The detection voltage V2 will correspond to the operating voltage range of the processor 310 of the conversion unit 300 (e.g., reducing the clamping voltage V1 to a certain percentage.)

In some other embodiments, the output circuit 230 further includes a filter circuit 232 including a resistance and a capacitor. The output circuit 230 first filters out the high frequency noise in the clamping voltage V1 through the filter circuit 232, then transmits the filtered voltage to the voltage divider circuit 231 to output the detection voltage V2.

Figure 3:
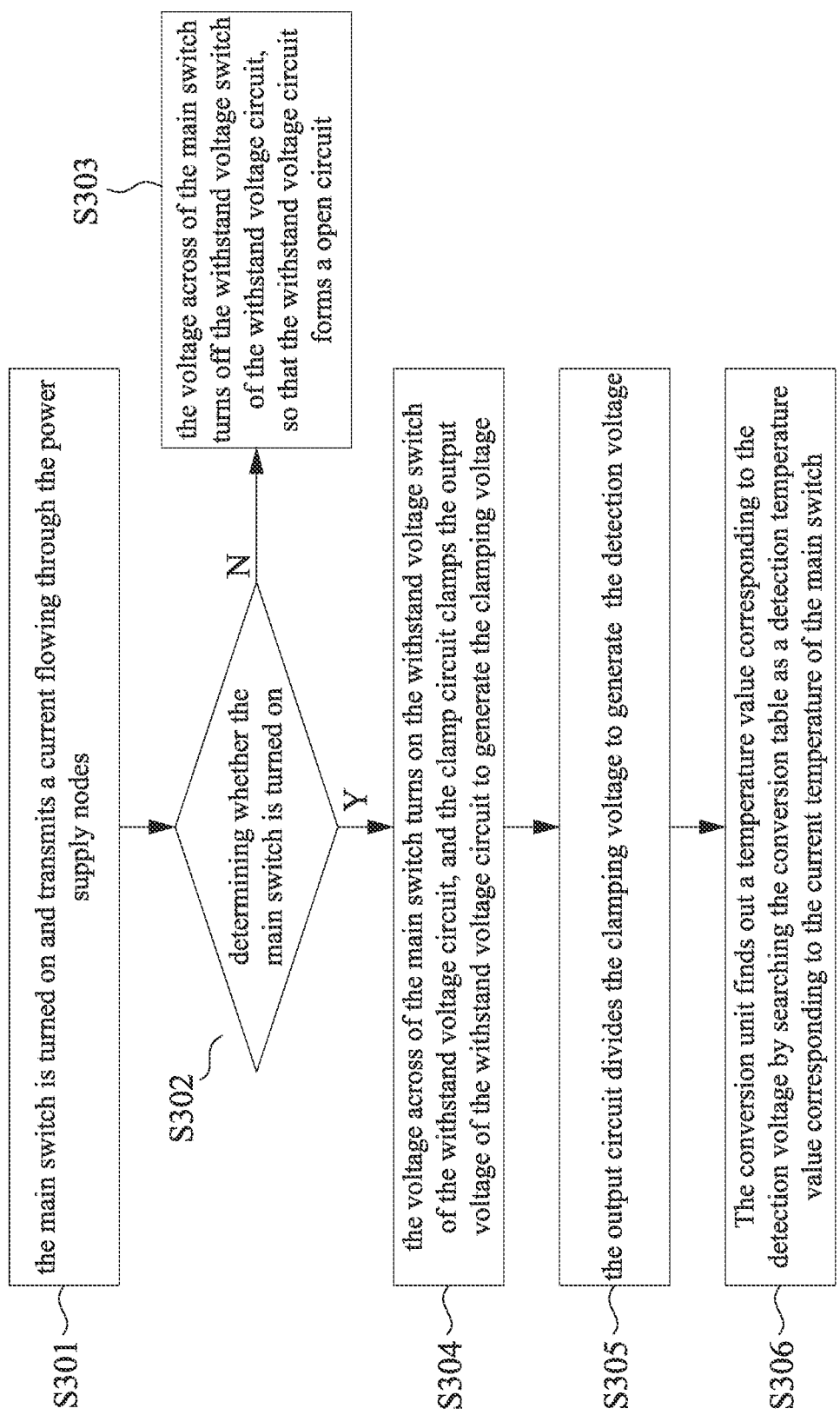
FIG. 3 is a flowchart illustrating a temperature detection method in some embodiments of the present disclosure.

FIG. 3 is a flowchart illustrating a temperature detection method in some embodiments of the present disclosure. In step S301, the main switch MS is turned on, so as to transmit a current flowing through the power supply nodes N1, N2. The main switch MS is electrically connected to the external device or a chip, and is controlled to be turned-on or turned-off with the operation of the external device or the chip.

In step S302, determining whether the main switch MS is turned on. If the main switch MS is turned off, in step S303, the voltage across of the main switch MS turns off the withstand voltage switch 211 of the withstand voltage circuit 210, so that the withstand voltage circuit 210 forms a open circuit.

If the main switch MS is turned on, in step S304, the voltage across of the main switch MS turns on the withstand voltage switch 211 of the withstand voltage circuit 210, and the clamp circuit 220 clamps the output voltage of the withstand voltage circuit 210 to generate the clamping voltage V1.

In step S305, the output circuit 230 divides the clamping voltage V1 to generate the detection voltage V2. The detection voltage V2 corresponds to the voltage across the two ends of the main switch MS, and corresponds to the operating voltage range of the processor in the conversion unit 300. In step S306, the conversion unit 300 receives the detection voltage. The conversion unit 300 stores the conversion table 321 in advance, which is the corresponding relationship between the detection voltage V2 and the temperature. The processor 310 finds out a temperature value corresponding to the detection voltage by searching the conversion table 321 as a detection temperature value corresponding to the current temperature of the main switch MS.

Figures 4A, 4B:
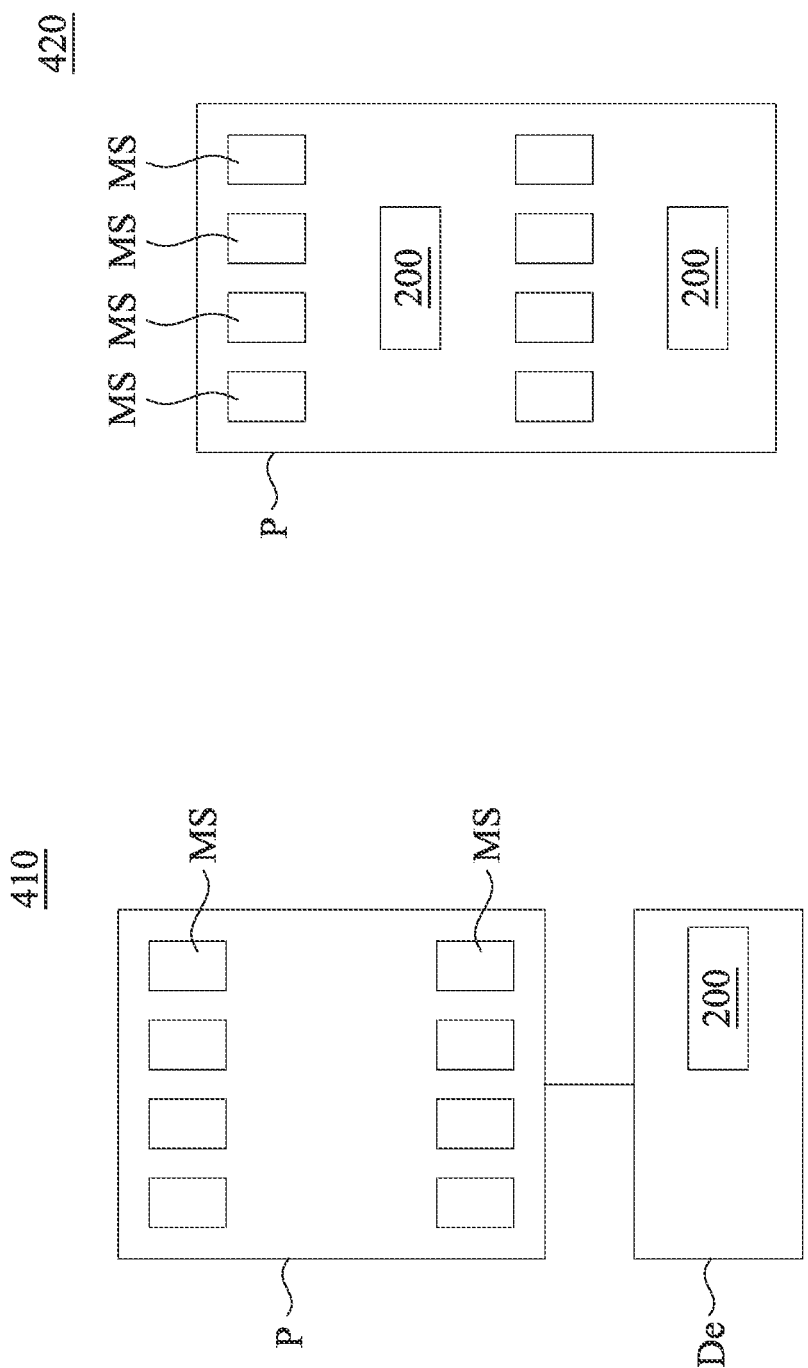
FIG. 4A-4D are schematic diagrams of a power module device in some other embodiments of the present disclosure.

In the embodiment shown in FIG. 1, the power module device 100 includes one main switch MS, but in some other embodiments, the power module device 100 may be packaged with multiple main switches MS. FIG. 4A-4C are schematic diagrams of power module devices 410-440 in some other embodiments of the present disclosure. In FIGS. 4A-4D, the similar components associated with the embodiment of FIG. 1 are labeled with the same numerals for ease of understanding. The specific principle of the similar component has been explained in detail in the previous paragraphs, and unless it has a cooperative relationship with the components of FIGS. 4A-4D, it is not repeated here.

As shown in FIG. 4A, the power module device 410 includes multiple main switches MS and a detection unit 200. Each of the main switches MS is electrically connected between the two detection nodes (as the first detection node Na and the second detection node Nb shown in FIG. 1), and each detection node is electrically connected between the two power supply nodes (as the power supply nodes N1, N2 shown in FIG. 1). Alternatively stated, two ends of every main switch MS substantially have a detection node. When the main switch MS is turned on, the main switch MS is configured to transmit a current flowing through the power supply nodes, so as to perform its function (e.g., control or adjust the current output to the external device or chip). The detection unit 200 is electrically connected to the main switch MS, and respectively detects the voltage across of the main switch MS, and generates the corresponding detection voltage.

As shown in FIG. 4A, the main switches MS are uniformly packaged on an independent circuit board P, and the detection unit 200 is arranged on another chip De. The circuit board P is electrically connected to the chip De, so that the detection unit 200 is electrically connected to the main switch MS though the chip De, and is configured to detect the voltage across the two ends of the main switches MS.

As shown in FIG. 4B, in some other embodiments, the detection unit 200 and the main switches MS are all arranged on the circuit board P, and are are electrically connected to each other through the circuit board P. Each of the detection units 200 correspond to a certain number of the main switches MS to detect the voltages across two ends of the main switches MS. The circuit details of the connection of the detection unit 200 to the multiple main switches MS are described in the following paragraphs.

As shown in FIG. 4C, in some embodiments, the main switches MS are uniformly packaged on an independent circuit board P, and the detection unit 200 is packaged together with a driver chip Dg (Gate Driver IC). The driver chip Dg is electrically connected to the circuit board P.

Figure 4D:
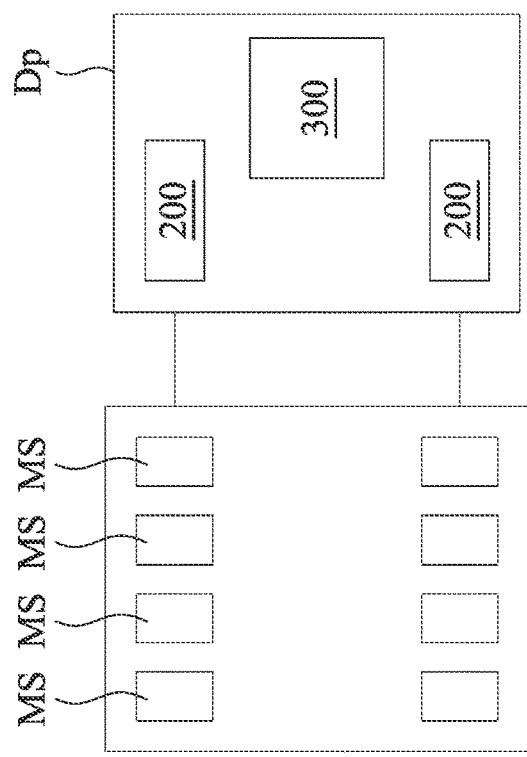
Figure 4C:
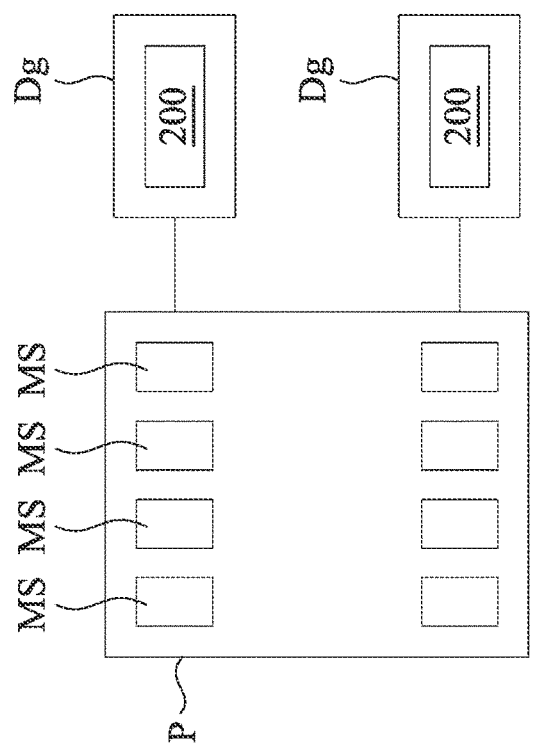

As shown in FIG. 4D, in some embodiments, the main switches MS are uniformly packaged on an independent circuit board P, and the detection unit 200 and the conversion unit 300 are packaged on another circuit board Dp (not shown in FIG. 4D) of the driver chip. The circuit board Dp is electrically connected to the main switches MS though the circuit board P.

Figure 5A:
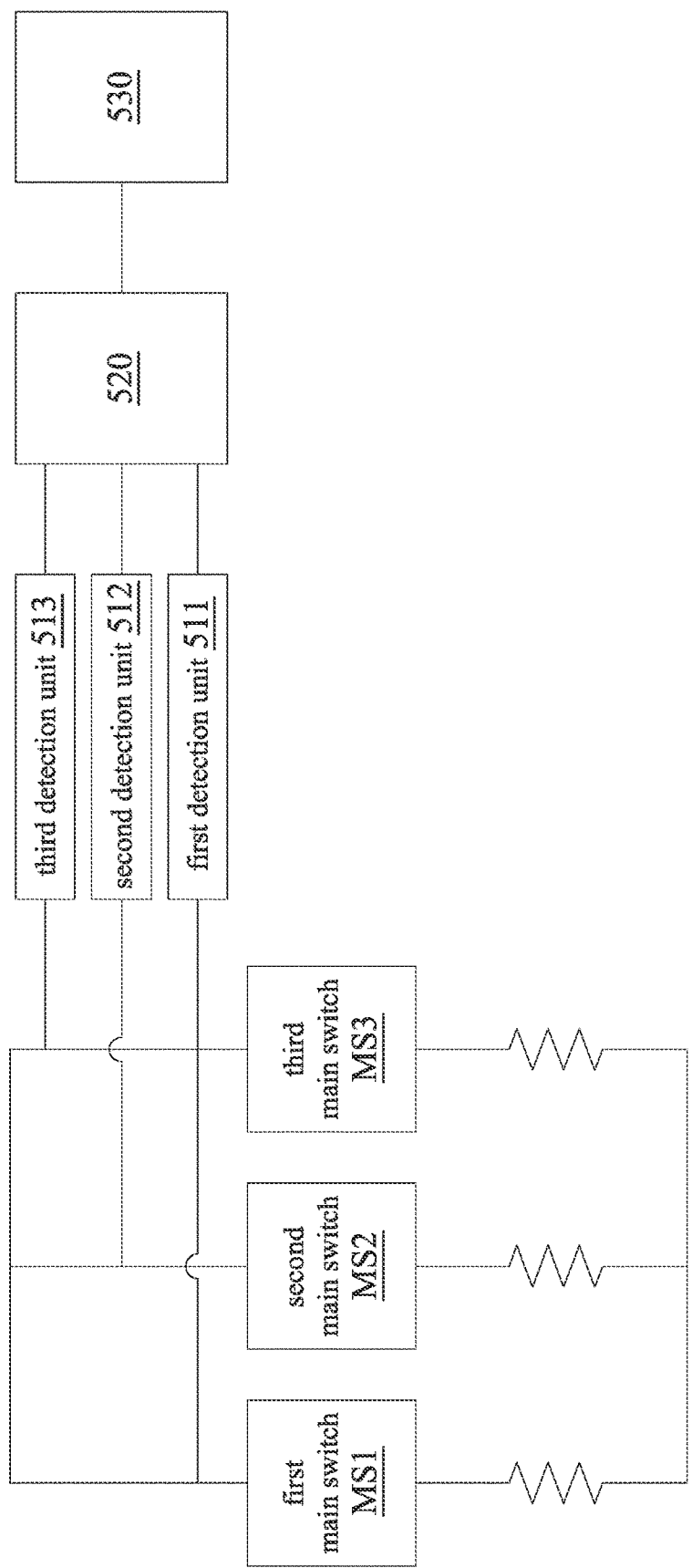
FIG. 5A-5C are schematic diagrams of a power module device in some other embodiments of the present disclosure.

FIG. 5A is a schematic diagram of a power module device 500 in some other embodiments of the present disclosure. The power module device 500 includes multiple main switches MS1-MS3, multiple detection units 511-513, a selector circuit 520 and a conversion unit 530. Each of the detection units 511-513 correspond to one of the main switches MS1-MS3 respectively, to detect the voltage across the two ends of the corresponding main switch, and obtain the corresponding detection voltage. For example, the first detection unit 511 is configured to detect a first detection voltage of the first main switch MS1, the second detection unit 512 is configured to detect a second detection voltage of the second main switch MS2, and the third detection unit 513 is configured to detect a third detection voltage of the third main switch MS3. The conversion unit 300 is selectively electrically connected to the detection units 511-513 through the selector circuit 520 (e.g., data selector) to receive the detection voltage.

Figure 5C:
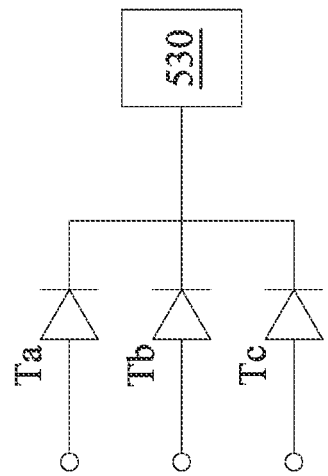
Figure 5B:
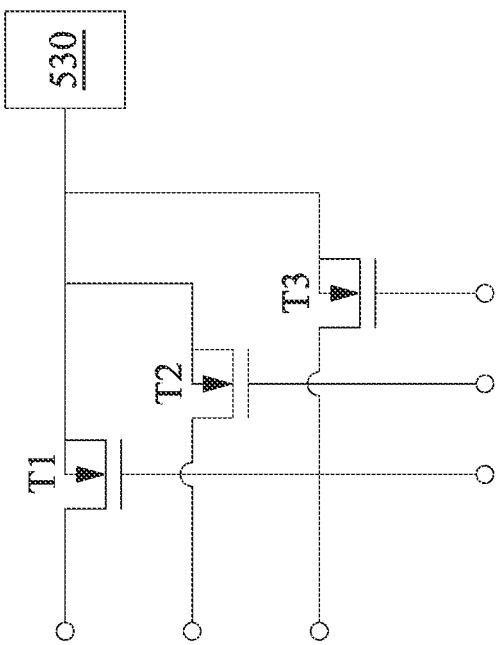

FIGS. 5B-5C are schematic diagrams of the selector circuit 520 in some other embodiments of the present disclosure. as shown in FIG. 5B, in one embodiment, the selector circuit 520 includes multiple controllable switches T1-T3, each of the controllable switches T1-T3 corresponds to one of the detection units 511-513, and is connected to the conversion unit 530. The power module device 500 is configured to conduct the control terminal of one of the controllable switches T1-T3, so that the conversion unit 300 may receive only one of the detection voltages at a time. Accordingly, the power module device 500 can periodically or sequentially detect the voltage across two ends of each of the main switches MS1-MS3, and determine the corresponding temperature value.

Ad shown in FIG. 5C, in some other embodiments, the selector circuit 520 includes multiple one-way switches Ta-Tc (e.g., diode). The one-way switches Ta-Tc are electrically connected to the detection unit 511-513, so as to receive the detection voltages output by the detection units 511-513. Each of the one-way switches Ta-Tc corresponds to one of the detection units 511-513, and is connected to the conversion unit 530. Since the one-way switches Ta-Tc are only turned on in one direction, when the detection units 511-513 all output the corresponding detection voltages, the conversion unit 530 will only receive one detection voltage with the highest value. Alternatively stated, the conversion unit 530 is electrically connected to the detection units 511-513 through one-way switches Ta-Tc, so as to receive detection voltages. The conversion unit 530 will find out the corresponding temperature value through the conversion table according to the current highest value of the detection voltages.

The elements, method steps, or technical features in the foregoing embodiments may be combined with each other, and are not limited to the order of the specification description or the order of the drawings in the present disclosure.

It will be apparent to those skilled in the art that various modifications and variations can be made to the structure of the present disclosure without departing from the scope or spirit of the present disclosure. In view of the foregoing, it is intended that the present disclosure cover modifications and variations of this present disclosure provided they fall within the scope of the following claims.

What is claimed is:

1. A power module device, comprising:
   a main switch electrically connected between a first detection node and a second detection node, wherein the first detection node and the second detection node are electrically connected between a plurality of power supply nodes, and are substantially two ends of the main switch, when the main switch is turned on, the main switch is configured to transmit a current flowing through the plurality of power supply nodes;
   a detection unit electrically connected to the first detection node and the second detection node, and configured to detect a voltage across the two ends of the main switch to generate a detection voltage; and
   a conversion unit electrically connected to the detection unit, and configured to receive the detection voltage, wherein the conversion unit comprises a processor, the processor is configured to search a conversion table according to the detection voltage without the current to obtain a temperature value corresponding to the detection voltage as a detection temperature value.

2. The power module device of claim 1, wherein the detection unit comprises:
   a withstand voltage circuit electrically connected to the first detection node, wherein the withstand voltage circuit is configured to form an open circuit according to the voltage across the two ends of the main switch when the main switch is turn off;
   a clamp circuit electrically connected to the withstand voltage circuit, and configured to clamp an output of the withstand voltage circuit to generate a clamping voltage; and
   an output circuit electrically connected to the clamp circuit, configured to receive the clamping voltage output by the clamp circuit, and configured to generate the detection voltage according to the clamping voltage.

3. The power module device of claim 2, wherein the clamp circuit is electrically connected between the withstand voltage circuit and the second detection node, and the withstand voltage circuit comprises:
   a withstand voltage switch, a first terminal of the withstand voltage switch electrically connected to the first detection node, a second terminal of the withstand voltage switch electrically connected to the clamp circuit, wherein when the main switch is turned off, the voltage across the two ends of the main switch is less than a rated voltage of the withstand voltage switch.

4. The power module device of claim 2, wherein the clamp circuit comprises at least a zener diode, and the clamping voltage of the clamp circuit is less than the voltage across the two ends of the main switch when the main switch is turned off.

5. The power module device of claim 1, further comprising:
   at least one parasitic resistance and at least one parasitic inductance electrically connected in series with each other between one of the first detection node and the second detection node and one of the plurality of power supply nodes.

6. The power module device of claim 5, wherein the detection unit comprises:
   a withstand voltage circuit electrically connected to the first detection node, wherein the withstand voltage circuit is configured to form an open circuit according to the voltage across the two ends of the main switch when the main switch is turn off;
   a clamp circuit electrically connected to the withstand voltage circuit, and configured to clamp an output of the withstand voltage circuit to generate a clamping voltage; and
   an output circuit electrically connected to the clamp circuit, configured to receive the clamping voltage output by the clamp circuit, and configured to generate the detection voltage according to the clamping voltage.

7. The power module device of claim 6, wherein the clamp circuit is electrically connected between the withstand voltage circuit and the second detection node, and the withstand voltage circuit comprises:
   a withstand voltage switch, a first terminal of the withstand voltage switch electrically connected to the first detection node, a second terminal of the withstand voltage switch electrically connected to the clamp circuit, wherein when the main switch is turned off, the voltage across the two ends of the main switch is less than a rated voltage of the withstand voltage switch; and
   wherein the clamp circuit comprises a zener diode, the clamping voltage of the clamp circuit is less than the voltage across the two ends of the main switch when the main switch is turned off.

8. A temperature detection method of a power module device, comprising:
   turning on a main switch to transmit a current flowing through a plurality of power supply nodes, wherein the main switch is electrically connected between a first detection node and a second detection node, the first detection node and the second detection node are electrically connected between the plurality of power supply nodes, and are substantially two ends of the main switch;
   detecting, by a detection unit, a voltage across the two ends of the main switch to generate a detection voltage, wherein the detection unit is electrically connected to the first detection node and the second detection node; and
   converting the detected voltage without the current to a detected temperature value.

9. The temperature detection method of claim 8, wherein converting the detected voltage to the detected temperature value further comprises:
  finding a temperature value corresponding to the detection voltage according to a conversion table as the detection temperature value.

10. The temperature detection method of claim 8, further comprising:
  turning off the main switch to form an open circuit in a withstand voltage circuit of the detection unit according to the voltage across the two ends of the main switch when the main switch is turn off.

11. The temperature detection method of claim 10, wherein detecting the voltage across the two ends of the main switch to generate the detection voltage further comprises:
  clamping, by a clamp circuit, an output of the withstand voltage circuit to generate a clamping voltage; and
  converting, by a voltage divider circuit, the clamping voltage to the detection voltage corresponding to an operating voltage range of a processor.

12. A power module device, comprising:
  a plurality of main switches, each of the plurality of main switches electrically connected between a plurality of detection nodes, wherein the plurality of detection nodes are electrically connected between a plurality of power supply nodes, and are substantially two ends of the each of the plurality of main switches, when the each of the plurality of main switches is turned on, the each of the plurality of main switches is configured to transmit a current flowing through the plurality of power supply nodes; and
  at least one detection unit electrically connected to the plurality of detection nodes, and configured to detect a voltage across the two ends of the main switch to generate a detection voltage; and
  a conversion unit electrically connected to the at least one detection unit, and configured to search a conversion table according to the detection voltage without the current to output a detection temperature value corresponding to the detection voltage.

13. The power module device of claim 12, wherein the plurality of main switches comprises a first main switch and a second main switch, the at least one detection unit comprises a first detection unit and a second detection unit, the first detection unit is configured to detect a first detection voltage of the first main switch, the second detection unit is configured to detect a second detection voltage of the second main switch, and the conversion unit selectively receives the first detection voltage or the second detection voltage.

14. The power module device of claim 12, wherein the plurality of main switches comprises a first main switch and a second main switch, the at least one detection unit comprises a first detection unit and a second detection unit, the first detection unit is configured to detect a first detection voltage of the first main switch, the second detection unit is configured to detect a second detection voltage of the second main switch, and the conversion unit is electrically connected to the first detection unit and the second detection unit through a plurality of one-way switches to receive the first detection voltage or the second detection voltage.

15. The power module device of claim 12, wherein the at least one detection unit arranged on a chip, and the chip electrically connected to the plurality of main switches.

16. The power module device of claim 12, wherein the at least one detection unit and the plurality of main switches are arranged on a circuit board.

17. The power module device of claim 12, wherein the at least one detection unit is packaged integrally with a driver chip.

18. The power module device of claim 12, wherein the at least one detection unit and the conversion unit are arranged on a circuit board, and the circuit board electrically connected to the plurality of main switches.

* * * * *